(12) United States Patent
Lee et al.

(10) Patent No.: US 11,889,738 B2
(45) Date of Patent: Jan. 30, 2024

(54) ORGANIC LIGHT-EMITTING DISPLAY DEVICE AND METHOD FOR MANUFACTURING THE SAME

(71) Applicant: Samsung Display Co., Ltd., Yongin-Si (KR)

(72) Inventors: Seung Chan Lee, Hwaseong-si (KR); Dong Hwan Shim, Hwaseong-si (KR); Yoo Min Ko, Suwon-si (KR); Sung Jin Hong, Seoul (KR); Gun Hee Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 17/834,185

(22) Filed: Jun. 7, 2022

(65) Prior Publication Data
US 2022/0302222 A1   Sep. 22, 2022

Related U.S. Application Data

(62) Division of application No. 16/997,540, filed on Aug. 19, 2020, now Pat. No. 11,387,288.

(30) Foreign Application Priority Data

Oct. 17, 2019 (KR) .................. 10-2019-0129193

(51) Int. Cl.
*H10K 50/87* (2023.01)
*H10K 59/88* (2023.01)
(Continued)

(52) U.S. Cl.
CPC ............ *H10K 59/88* (2023.02); *H10K 50/87* (2023.02); *H10K 59/131* (2023.02); *H10K 71/00* (2023.02);
(Continued)

(58) Field of Classification Search
CPC ...... H10K 59/88; H10K 59/131; H10K 71/00; H10K 50/87
See application file for complete search history.

(56) References Cited

U.S. PATENT DOCUMENTS

2014/0353606 A1* 12/2014 Choi .................... H10K 50/824
438/46
2016/0071914 A1* 3/2016 Lee ...................... H10K 59/122
438/46
(Continued)

FOREIGN PATENT DOCUMENTS

KR       10-1763442 B1    7/2017
KR   10-2017-0122432 A   11/2017

*Primary Examiner* — Suberr L Chi
(74) *Attorney, Agent, or Firm* — Innovation Counsel LLP

(57) ABSTRACT

An organic light-emitting display device includes a pixel area and a transmitting area adjacent to the pixel area. The organic light-emitting display device includes an organic light-emitting diode, a driving power wiring, and a heating pattern adjacent to the driving power wiring. The organic light-emitting diode includes a first electrode disposed in the pixel area, an organic light-emitting layer disposed on the first electrode and a second electrode disposed on the organic light-emitting layer. The driving power wiring is electrically connected to the second electrode. A portion of the organic light-emitting layer is disposed in the transmitting area. The organic light-emitting layer includes an opening area overlapping the heating pattern and at least a portion of the driving power wiring. The second electrode electrically contacts the driving power wiring through the opening area.

8 Claims, 18 Drawing Sheets

(51) Int. Cl.
*H10K 59/131* (2023.01)
*H10K 71/00* (2023.01)
*H10K 59/35* (2023.01)
*H10K 59/12* (2023.01)
*H10K 71/20* (2023.01)

(52) U.S. Cl.
CPC ......... *H10K 59/1201* (2023.02); *H10K 59/35* (2023.02); *H10K 71/20* (2023.02)

(56) References Cited

U.S. PATENT DOCUMENTS

2018/0366586 A1 12/2018 Son et al.
2020/0075882 A1 3/2020 Wang et al.

* cited by examiner

ORGANIC LIGHT-EMITTING DISPLAY DEVICE AND METHOD FOR MANUFACTURING THE SAME

CROSS-REFERENCE TO RELATED APPLICATION

This application is a divisional application of U.S. patent application Ser. No. 16/997,540 filed on Aug. 19, 2020, which claims priority to Korean Patent Application No. 10-2019-0129193 filed on Oct. 17, 2019, and all the benefits accruing therefrom under 35 U.S.C. § 119, the entire disclosures of which are incorporated by reference herein in their entirety.

BACKGROUND

1. Field

Embodiments relate to a display device. More particularly, embodiments relate to an organic light-emitting display device and a method for manufacturing an organic light-emitting display device.

2. Description of the Related Art

A display device converts an electric signal to display an image providing a user with visual information. The display device may include a transmitting area which transmits an external light incident on the transmitting area. A functional module such as a camera module, a sensor module or the like, which is disposed in the rear of a display device, may perceive or detect an object, a person or the like, which is disposed in front of the display device.

SUMMARY

Embodiments provide an organic light-emitting display device having a substantially enlarged display area and an improved design.

Embodiments provide a method for manufacturing an organic light-emitting display device.

In an embodiment, an organic light-emitting display device includes a pixel area and a transmitting area adjacent to the pixel area. The organic light-emitting display device includes an organic light-emitting diode, a driving power wiring and a heating pattern adjacent to the driving power wiring. The organic light-emitting diode includes a first electrode disposed in the pixel area, an organic light-emitting layer disposed on the first electrode and a second electrode disposed on the organic light-emitting layer. The driving power wiring is electrically connected to the second electrode. A portion of the organic light-emitting layer is disposed in the transmitting area. The organic light-emitting layer includes an opening area overlapping the heating pattern and at least a portion of the driving power wiring. The second electrode electrically contacts the driving power wiring through the opening area.

In an embodiment, the heating pattern and the driving power wiring are disposed in a same layer as the first electrode.

In an embodiment, the organic light-emitting display device further includes a heating power wiring electrically connected to the heating pattern.

In an embodiment, the organic light-emitting display device further includes an active pattern, a gate electrode overlapping the active pattern, and a drain electrode electrically contacting the first electrode and the active pattern. The heating power wiring is disposed in a same layer as the drain electrode.

In an embodiment, the transmitting area does not overlap the second electrode.

In an embodiment, the transmitting area surrounds an electrode area in which the second electrode is disposed, in a plan view.

In an embodiment, a portion of the opening area overlaps the transmitting area.

In an embodiment, at least a portion of the heating pattern is disposed in the transmitting area.

In an embodiment, the heating pattern includes a transparent conductive material.

In an embodiment, the heating pattern is spaced apart from the second electrode.

In an embodiment, the heating pattern contacts the second electrode.

In an embodiment, the organic light-emitting display device further includes a functional module overlapping the pixel area and the transmitting area. The functional module includes at least one of a camera module and a sensor module.

According to an embodiment, a method for manufacturing an organic light-emitting display device is provided. According to the method, a driving element is formed on a base substrate. A first electrode electrically connected to the driving element is formed. A heating pattern spaced apart from the first electrode is formed. A driving power wiring adjacent to the heating pattern is formed. An organic light-emitting layer is formed to cover the first electrode, the heating pattern and the driving power wiring. The heating pattern is heated to remove a portion of the organic light-emitting layer, which is adjacent to the heating pattern, to form an opening area exposing the driving power wiring. A second electrode is formed on the organic light-emitting layer. The second electrode electrically contacts the driving power wiring through the opening area.

According to the embodiments, a second electrode, e.g., a common electrode, of an organic light-emitting diode includes patterns separated from each other. Thus, a transmitting area may be increased in a display area where a functional module is disposed. Furthermore, the second electrode is formed through a single deposition process without an additional patterning process or a plurality of deposition processes. Thus, damage to an organic light-emitting layer may be prevented, and decrease of the transmitting area may be prevented.

Furthermore, since an opening area of the organic light-emitting layer is formed by Joule heat of the heating pattern without using an expensive process such as laser drilling, damage to the organic light-emitting layer may be prevented, and a manufacturing efficiency may be increased.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

An organic light-emitting display device and a method for manufacturing an organic light-emitting display device according to embodiments of the present inventive concept will be described hereinafter with reference to the accompanying drawings, in which some embodiments are shown.

Figure 1:
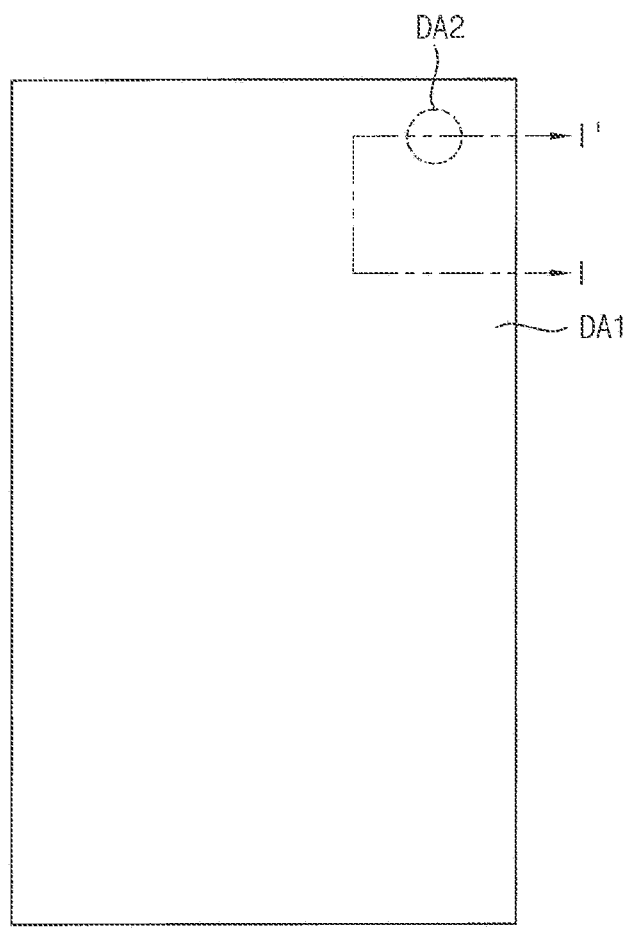
FIG. 1 is a plan view illustrating a display device according to an embodiment.
Figure 2:
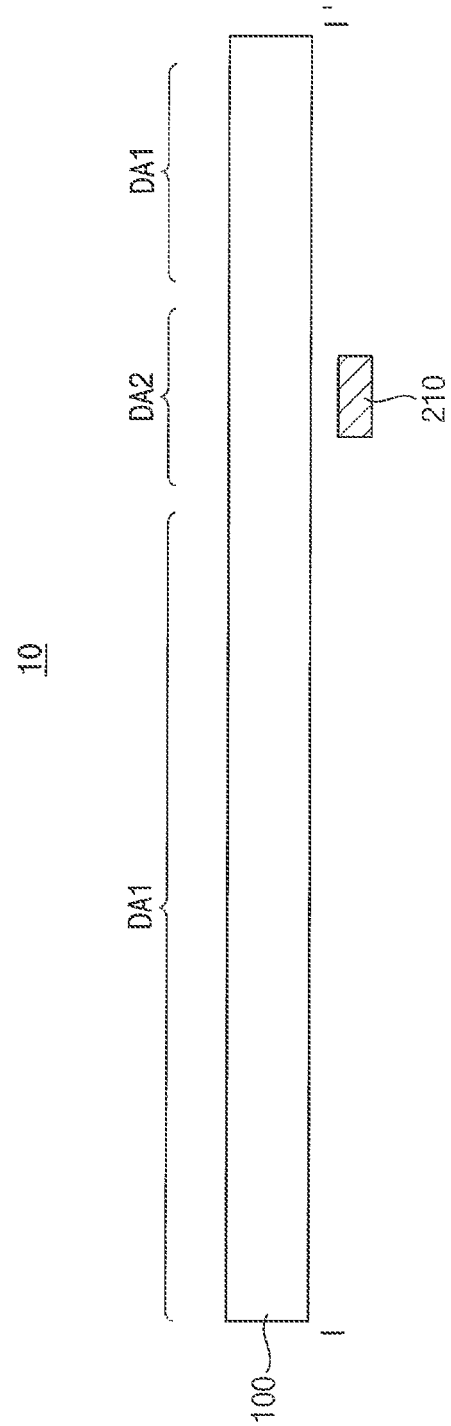
FIG. 2 is a cross-sectional view taken along the line I-I' of FIG. 1.

FIG. 1 is a plan view illustrating a display device 10 according to an embodiment. FIG. 2 is a cross-sectional view taken along the line I-I' of FIG. 1.

Referring to FIGS. 1 and 2, the display device 10 includes a display panel 100 and a functional module 210.

The display panel 100 may include a first display area DA1 and a second display area DA2. The first display area DA1 and the second display area DA2 may display an image, respectively. The second display area DA2 may include a transmitting area that transmits an external light. Thus, the second display area DA2 may transmit an external light incident on the second display area DA2 as well as display an image. The first display area DA1 and the second display area DA2 may be adjacent to each other. For example, the first display area DA1 may have a shape surrounding the second display area DA2.

The functional module 210 is disposed under the display panel 100. Examples of the functional module 210 may include a camera module, a face recognition sensor module, an iris recognition sensor module, an acceleration sensor module, a geomagnetism sensor module, a near sensor module, an IR sensor module, an illumination sensor module or the like. The camera module may be used for imaging an object in front of the display panel 100. The face recognition sensor module may be used for recognizing a face of a user. The iris recognition sensor module may be used for recognizing an iris of a user. The acceleration sensor module and the geomagnetism sensor module may be used for determining movement of the display device 10. The near sensor module and IR sensor module may be used for sensing an object getting close to the display device 10. The illumination sensor module may be used for measuring an external brightness.

In an embodiment, the functional module 210 may be disposed under the second display area DA2. As explained above, the second display area DA2 may include a transmitting area. Thus, the functional module 210 disposed on a rear surface of the display panel 100 may detect or image an object or a person, which is disposed in front of the display device 10, through the transmitting area of the second display area DA2.

Figure 3:
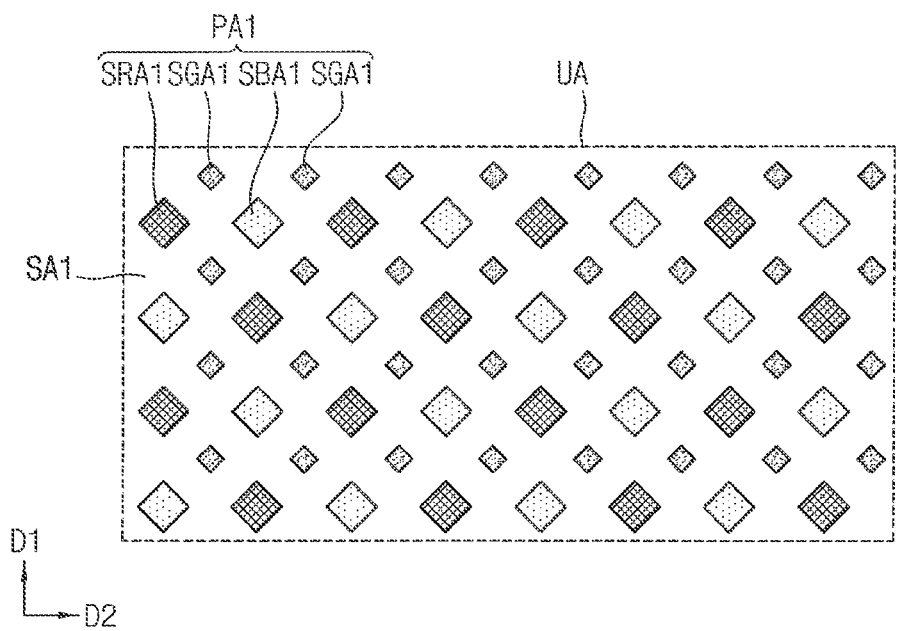
FIG. 3 is an enlarged plan view illustrating a first display area of a display device according to an embodiment.
Figure 4:
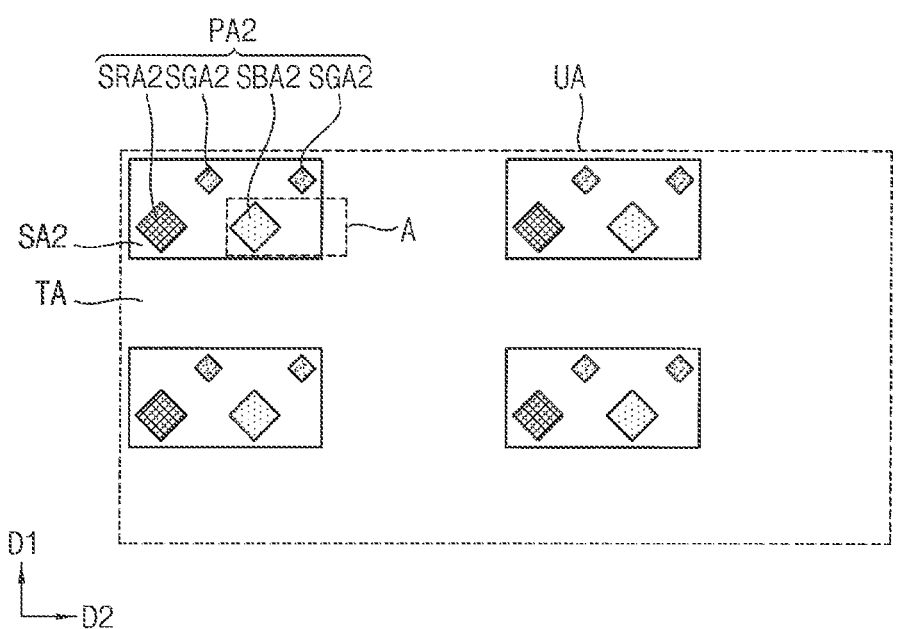
FIG. 4 is an enlarged plan view illustrating a second display area of a display device according to an embodiment.

FIG. 3 is an enlarged plan view illustrating the first display area DA1 of the display device 10 according to an embodiment. FIG. 4 is an enlarged plan view illustrating the second display area DA2 of the display device 10 according to an embodiment.

The first display area DA1 may include a first pixel area PA1 and a first surrounding area SA1. The second display area DA2 may include a second pixel area PA2, a transmitting area TA and a second surrounding area SA2. Pixels may be disposed in the first pixel area PA1 and the second pixel area PA2, and a light generated by the pixels may exit from the first pixel area PA1 and the second pixel area PA2.

The first pixel area PA1 may include first subpixel areas SRA1, SGA1 and SBA1, which emit lights having different colors from each other. The second pixel area PA2 may include second subpixel areas SRA2, SGA2 and SBA2, which emit lights having different colors from each other. In an embodiment, the first subpixel areas SRA1, SGA1 and SBA1 may include a first red pixel area SRA1, a first green pixel area SGA1, and a first blue pixel area SBA1, respectively. The second subpixel areas SRA2, SGA2 and SBA2 may include a second red pixel area SRA2, a second green pixel area SGA2, and a second blue pixel area SBA2, respectively. However, the number of the subpixels disposed in the second pixel area PA2 may be varied.

The transmitting area TA may transmit an external light incident on the display panel 100. Since the second display area DA2 includes the transmitting area TA, which transmits an external light, the functional module 210 overlapping the second display area DA2 may detect or image an object or a person, which is disposed in front of the display device 10, through the transmitting area TA. The first surrounding area SA1 may surround the first pixel area PA1. The second surrounding area SA2 may surround the second pixel area PA2. The first surrounding area SA1 and the second surrounding area SA2 may block an external light and may not emit a light. The transmitting area TA may surround the second pixel area PA2 and the second surrounding area SA2.

Since the second display area DA2 includes the transmitting area TA, the number of the second subpixel areas SRA2, SGA2 and SBA2 disposed in a unit area may be smaller than the number of the first subpixel areas SRA1, SGA1 and SBA1 in a unit area. Thus, a resolution of the second display area DA2 may be less than a resolution of the first display area DA1. In an embodiment, a ratio of the transmitting area TA to the second display area DA2 may be equal to or more than ½ of an entire area of the second display area DA2. The resolution may mean the number of pixels or subpixels in a unit area.

In an embodiment, the number of the second subpixel areas SRA2, SGA2 and SBA2 disposed in a unit area may be ¼ of the number of the first subpixel areas SRA1, SGA1 and SBA1 in a unit area. For example, as illustrated in FIGS. 3 and 4, when the number of the first subpixel areas SRA1, SGA1 and SBA1 in a unit area UA is 64, the number of the second subpixel areas SRA2, SGA2 and SBA2 disposed in a unit area UA may be 16.

In an embodiment, structuring of the second subpixel areas SRA2, SGA2 and SBA2 may be substantially the same as that of the first subpixel areas SRA1, SGA1 and SBA1. However, in an embodiment, the second subpixel areas SRA2, SGA2 and SBA2 may have structuring different from the first subpixel areas SRA1, SGA1 and SBA1.

In an embodiment, a size of the second subpixel areas SRA2, SGA2 and SBA2 may be substantially same as a size of the first subpixel areas SRA1, SGA1 and SBA1. For example, the second red pixel area SRA2, the second green pixel area SGA2, and the second blue pixel area SBA2 may have a substantially same size as the first red pixel area SRA1, the first green pixel area SGA1, and the first blue pixel area SBA1, respectively. However, in an embodiment, the second red pixel area SRA2, the second green pixel area SGA2, and the second blue pixel area SBA2 may have different sizes as the first red pixel area SRA1, the first green pixel area SGA1, and the first blue pixel area SBA1, respectively, or may have different sizes from each other.

Figure 5:
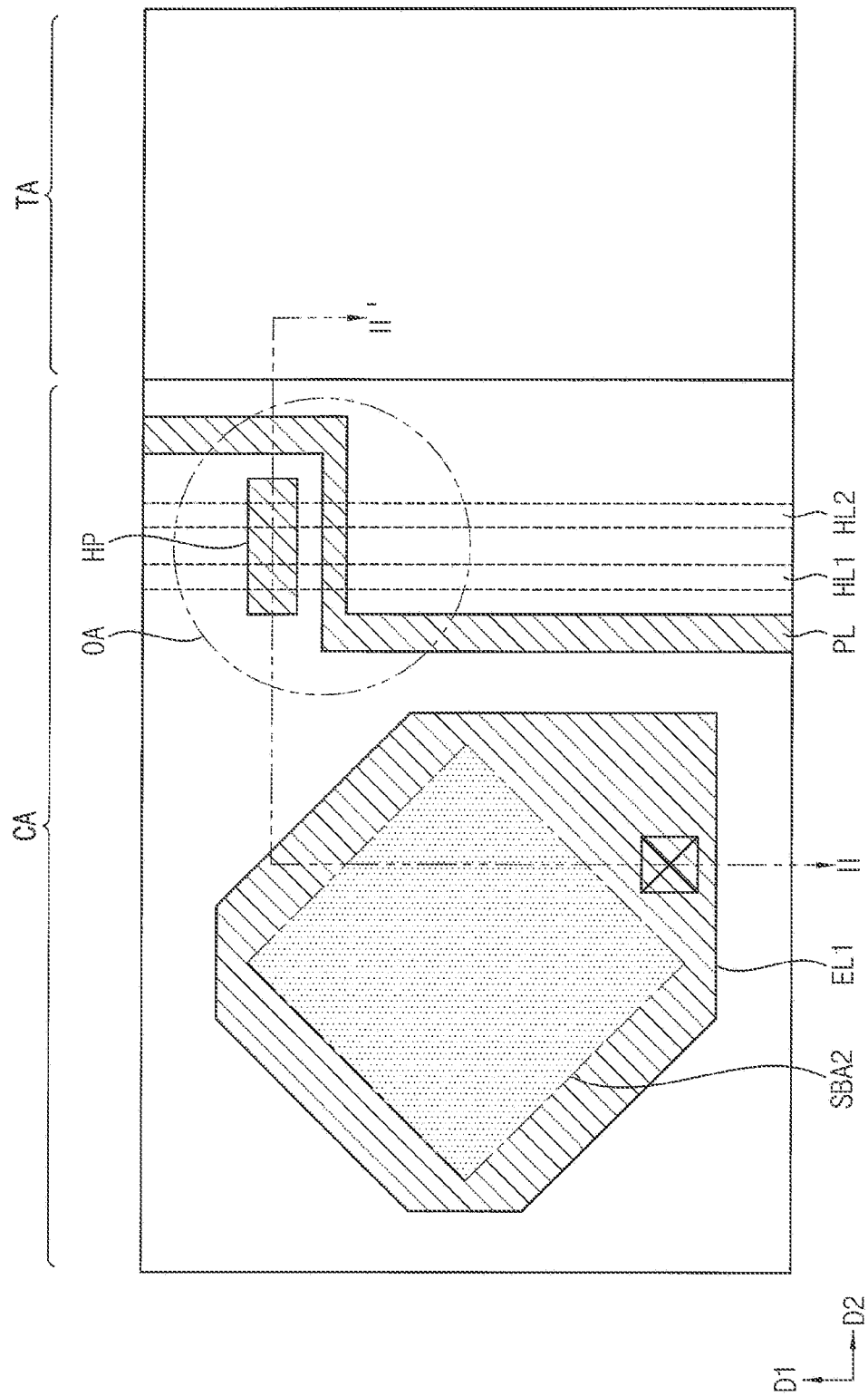
FIG. 5 is an enlarged plan view illustrating the region A of FIG. 4.
Figure 6:
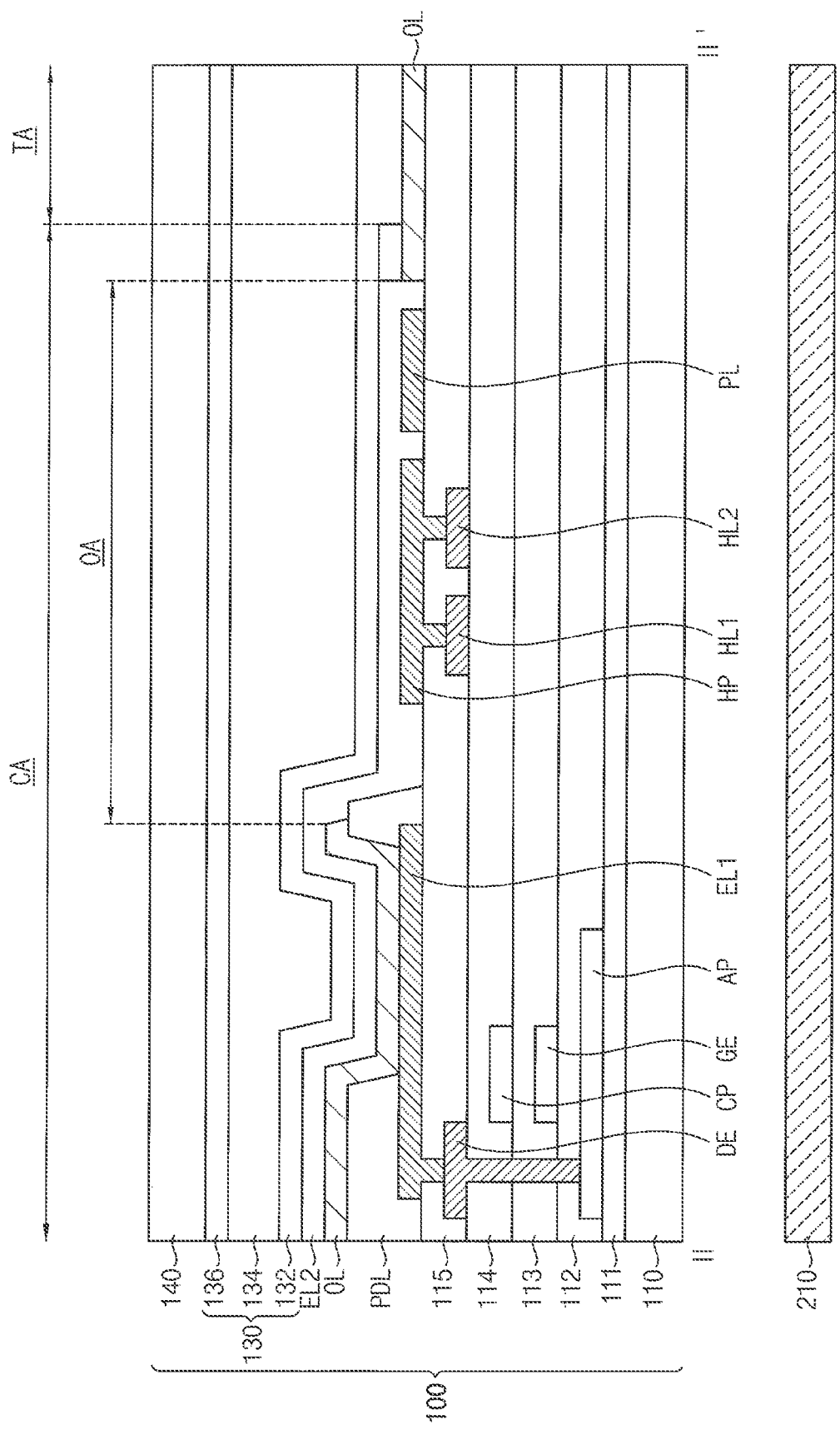
FIG. 6 is a cross-sectional view taken along the line II-II' of FIG. 5.

FIG. 5 is an enlarged plan view illustrating the region A of FIG. 4. FIG. 6 is a cross-sectional view taken along the line II-II' of FIG. 5. Particularly, FIGS. 5 and 6 may illustrate the second blue subpixel area SBA2 and the transmitting area TA in the second display area DA2.

Referring to FIGS. 5 and 6, the functional module 210 is disposed below the display panel 100. The display panel 100 includes a driving element disposed on a base substrate 110. The driving element may be electrically connected to a corresponding light-emitting element. The driving element may include thin film transistors. Hereinafter, a configuration of a single thin film transistor will be explained as an example.

The light-emitting element may include an organic light-emitting diode. For example, the organic light-emitting diode may include a first electrode EL1, a second electrode EL2 and an organic light-emitting layer OL disposed between the first electrode EL1 and the second electrode EL2. The first electrode EL1 may be referred to as a pixel electrode, and the second electrode EL2 may be referred to as a counter electrode or a common electrode.

A buffer layer 111 is disposed on the base substrate 110. An active pattern AP is disposed on the buffer layer 111. A gate electrode GE is disposed on the active pattern AP. A first insulation layer 112 is disposed between the active pattern AP and the gate electrode GE. The first insulation layer 112 may be referred to as a first gate insulation layer.

A capacitor electrode pattern CP is disposed on the gate electrode GE. The capacitor electrode pattern CP may include a capacitor electrode, a signal wiring for transferring a driving signal, or the like. A second insulation layer 113 is disposed between the gate electrode GE and the capacitor electrode pattern CP. The second insulation layer 113 may be referred to as a second gate insulation layer. A third insulation layer 114 is disposed on the capacitor electrode pattern CP. The third insulation layer 114 may be referred to as an interlayer insulation layer.

A drain electrode DE is disposed on the third insulation layer 114. The drain electrode DE may pass through the insulation layers disposed under the drain electrode DE to electrically contact the active pattern AP. A fourth insulation layer 115 is disposed on a first source metal pattern including the drain electrode DE. In an embodiment, the fourth insulation layer 115 may include an organic layer. The fourth insulation layer 115 may be referred to as a via insulation layer.

The first electrode EL1 is disposed on the fourth insulation layer 115, and electrically contacts the drain electrode DE. The first electrode EL1 may function as an anode. For example, the first electrode EL1 may be formed as a transmitting electrode or a reflecting electrode according to an emission type of the display device 10. For example, the first electrode EL1 may include a metal, a metal alloy, a conductive metal oxide or a combination thereof.

A pixel-defining layer PDL is disposed on the fourth insulation layer 115 may have an opening extending to and exposing at least a portion of the first electrode EL1. For example, the pixel-defining layer PDL may include an organic insulation material. At least a portion of the organic light-emitting layer OL may be disposed in the opening of the pixel-defining layer PDL. In an embodiment, the organic light-emitting layer OL may include at least one common layer extending over pixels in the display area. The organic light-emitting layer OL may include patterns spaced apart from each other and respectively disposed in corresponding subpixel areas.

In an embodiment, a second source metal pattern and a fifth insulation layer covering the second source metal pattern may be further disposed between the first electrode EL1 and the fourth insulation layer 115. The second source metal pattern may include a connection electrode electrically connecting the drain electrode DE to the first electrode EL1, a mesh power line or the like.

The organic light-emitting layer OL may include at least a light-emitting layer, and may further include at least one of a hole injection layer (HIL), a hole transporting layer (HTL), an electron transporting layer (ETL) and an electron injection layer (EIL). For example, the organic light-emitting layer OL may include a low molecular weight organic compound or a high molecular weight organic compound.

In an embodiment, the organic light-emitting layer OL may emit a light having a color depending on a corresponding subpixel area. For example, the organic light-emitting layer OL disposed in the second blue subpixel area SBA2 may emit a blue light.

In an embodiment, the second electrode EL2 may function as an cathode. For example, the second electrode EL2 may be formed as a transmitting electrode or a reflecting electrode according to an emission type of the display device 10. For example, the second electrode EL2 may include a metal, a metal alloy, a metal nitride, a metal fluoride, a conductive metal oxide or a combination thereof. For example, the second electrode EL2 may continuously overlap pixel areas or subpixel areas.

The display panel 100 may further include an encapsulation layer 130 covering the organic light-emitting diode. The encapsulation layer 130 may extend to cover a substantially entire portion of the display area.

For example, the encapsulation layer 130 may have a stacked structure of an organic thin film and an inorganic thin film. For example, as illustrated in FIG. 6, the encapsulation layer 130 may include a first inorganic thin film 132, an organic thin film 134 disposed on the first inorganic thin film 132, and a second inorganic thin film 136 disposed on the organic thin film 134. However, in an embodiment, the encapsulation layer 130 may include at least two organic thin films and at least three inorganic thin films.

For example, the organic thin film 134 may include a cured resin such as polyacrylate or the like. For example, the cured resin may be formed from cross-linking reaction of monomers. For example, the inorganic thin films 132 and 136 may include an inorganic material such as silicon oxide, silicon nitride, silicon carbide, aluminum oxide, tantalum oxide, hafnium oxide, zirconium oxide, titanium oxide or the like.

In an embodiment, a window cover 140 may be disposed on the encapsulation layer 130 to protect the display panel 100. For example, the window cover 140 may include glass or a polymeric material.

Even though not illustrated, at least one of a polarizing layer and a touch-sensing part may be disposed between the window cover 140 and the encapsulation layer 130.

In an embodiment, the transmitting area TA may be defined by an area where the second electrode EL2 is not disposed. An area where the second electrode EL2 is disposed may define an electrode area CA.

In an embodiment, the second electrode EL2 may have a pattern shape, of which at least a portion is surrounded by the transmitting area TA in the second display area DA2.

Suitably, a component having a relatively high reflectivity such as a metal wiring, a metal electrode or the like may be excluded from the transmitting area TA.

For example, a component having a relatively high transmittance such as an inorganic insulation layer, an organic insulation layer, an encapsulation layer, an organic light-emitting layer or the like may be disposed in the transmitting area TA. At least one of the layers may be omitted or excluded to further increase a transmittance.

In an embodiment, the display panel 100 includes a heating pattern HP and a heating power wiring that provides a power to the heating pattern HP. For example, the heating pattern HP may be formed from a same layer as the first electrode EL1 of the organic light-emitting diode. Thus, the heating pattern HP may be disposed on the fourth insulation layer 115. In an embodiment, the heating pattern HP may be disposed in the electrode area CA and may contact the second electrode EL2.

In an embodiment, the heating power wiring may include a first heating power wiring HL1 and a second heating power wiring HL2. For example, the first heating power wiring HL1 and the second heating power wiring HL2 may be included in the first source metal pattern. Thus, the first heating power wiring HL1 and the second heating power wiring HL2 may be formed from a same layer as the drain electrode DE, and may be disposed between the fourth insulation layer 115 and the third insulation layer 114. For example, the first heating power wiring HL1 and the second heating power wiring HL2 may extend in a first direction D1 to be parallel with each other.

In an embodiment, the display panel 100 may further include a driving power wiring PL to provide a power voltage to the second electrode EL2. When the second electrode EL2 is entirely continuous in the display area, the second electrode EL2 may electrically contact a power wiring in a peripheral area to receive a power voltage. However, when the second electrode EL2 has an isolated pattern shape, the driving power wiring PL disposed in the display area is necessary to provide the power voltage.

In an embodiment, the driving power wiring PL may be formed from a same layer as the first electrode EL1. For example, the driving power wiring PL may extend in the first direction D1 and/or in a second direction D2 crossing the first direction D1. The driving power wiring PL may extend into a peripheral area of the display panel 100 and may be electrically connected to a power bus wiring disposed in the peripheral area. In an embodiment, the driving power wiring PL may extend continuously in the second display area DA2 to be connected to second electrodes EL2. In an embodiment, the driving power wiring PL may include patterns electrically connecting adjacent second electrodes EL2 to each other, respectively.

In an embodiment, the driving power wiring PL may be adjacent to the heating pattern HP. The organic light-emitting layer OL may have an opening area OA adjacent to the heating pattern HP. The opening area OA partially overlaps the driving power wiring PL. Thus, a portion of the driving power wiring PL may electrically contact the second electrode EL2 through the opening area OA. Thus, at least a portion of the opening area OA may overlap the second electrode EL2. In an embodiment, an entire portion of the opening area OA may overlap the second electrode EL2.

In embodiments, a shape of the opening area OA may have a circular shape, an oval shape, a polygonal shape or an irregular shape. The organic light-emitting layer OL may be disposed in the display area except for the opening area OA. Thus, the organic light-emitting layer OL may overlap at least a portion of the transmitting area TA.

FIGS. 7, 8, 9, 10, 11, and 12 are cross-sectional views illustrating a method for manufacturing a display device according to an embodiment.

Figure 7:
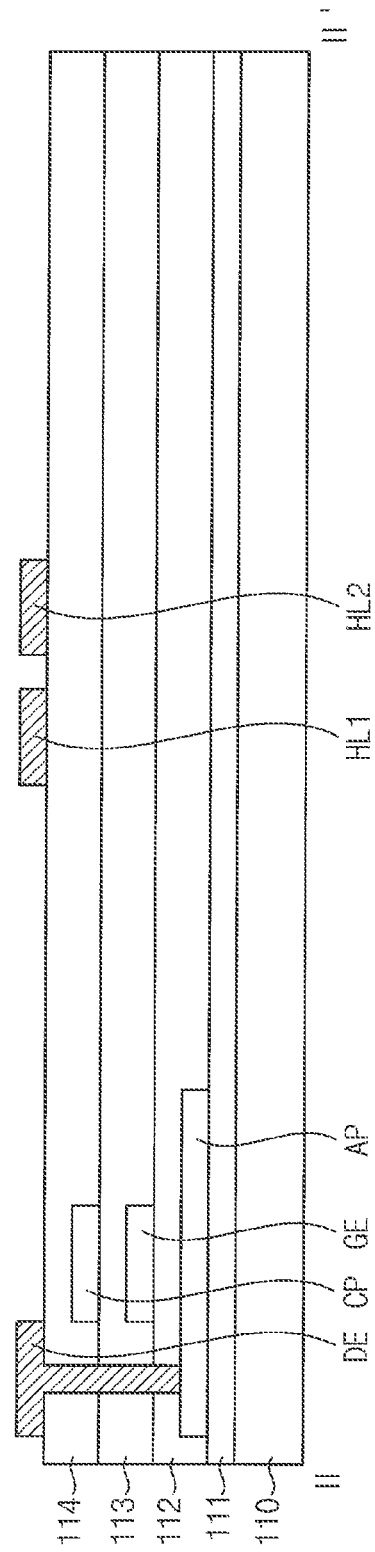
FIGS. 7, 8, 9, 10, 11, and 12 are cross-sectional views illustrating a method for manufacturing a display device.

Referring to FIG. 7, a buffer layer 111 is formed on a base substrate 110.

For example, the base substrate 110 may include glass, quartz, silicon, a polymeric material or the like. In an embodiment, the base substrate 110 may be a flexible substrate including the polymeric material. For example, the polymeric material may include polyethylene terephthalate, polyethylene naphthalate, polyether ketone, polycarbonate, polyarylate, polyether sulfone, polyimide or a combination thereof.

The buffer layer 111 may prevent or reduce penetration of impurities, humidity or external gas from underneath of the base substrate 110, and may planarize an upper surface of the base substrate 110. For example, the buffer layer 111 may include an inorganic material such as silicon oxide, silicon nitride or the like, or a combination thereof.

An active pattern AP is formed on the buffer layer 111.

For example, the active pattern AP may include a semiconductive material such as amorphous silicon, polycrystalline silicon (polysilicon), a metal oxide or the like. When the active pattern AP may include polysilicon, at least a portion of the active pattern AP may be doped with impurities such as n-type impurities or p-type impurities.

In an embodiment, the active pattern AP may include a metal oxide semiconductor. For example, the active pattern AP may include a two-component compound (ABx), a ternary compound (ABxCy) or a four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern AP may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

A first insulation layer 112 is formed on the active pattern AP. A first gate metal pattern including a gate electrode GE is formed on the first insulation layer 112. The gate electrode GE overlaps the active pattern AP. A second insulation layer 113 is formed to cover the first gate metal pattern. A second gate metal pattern including a capacitor electrode pattern CP is formed on the second insulation layer 113.

For example, the first insulation layer 112 and the second insulation layer 113 may respectively include silicon oxide, silicon nitride, silicon oxynitride or a combination thereof. Furthermore, the first insulation layer 112 and the second insulation layer 113 may include an insulating metal oxide such as aluminum oxide, tantalum oxide, hafnium oxide, zirconium oxide, titanium oxide or the like. For example, the first insulation layer 112 and the second insulation layer 113 may respectively have a single-layered structure or a multi-layered structure, which may silicon nitride and/or silicon oxide.

For example, the first gate metal pattern and the second gate metal pattern may respectively include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A third insulation layer 114 is then formed to cover the second gate metal pattern. A first source metal pattern is then formed on the third insulation layer 114. The first source metal pattern may include a drain electrode DE, which electrically contacts the active pattern AP. For example, the drain electrode DE may pass through the third insulation layer 114, the second insulation layer 113 and the first insulation layer 112 to electrically contact the active pattern AP.

For example, the first source metal pattern may include gold, silver, aluminum, copper, nickel, platinum, magnesium, chromium, tungsten, molybdenum, titanium, tantalum or an alloy thereof, and may have a single-layered structure or a multi-layered structure including different metal layers. In an embodiment, the first source metal pattern may include at least a layer contains aluminum or aluminum alloy. For example, the first source metal pattern may respectively have a bi-layered structure of titanium/aluminum or a triple-layered structure of titanium/aluminum/titanium.

The first source metal pattern further includes a heating power wiring. The heating power wiring may include a first heating power wiring HL1 and a second heating power wiring HL2.

Even though not illustrated, the first source metal pattern may further include a source electrode, a data line, a power line or the like.

Figure 8:
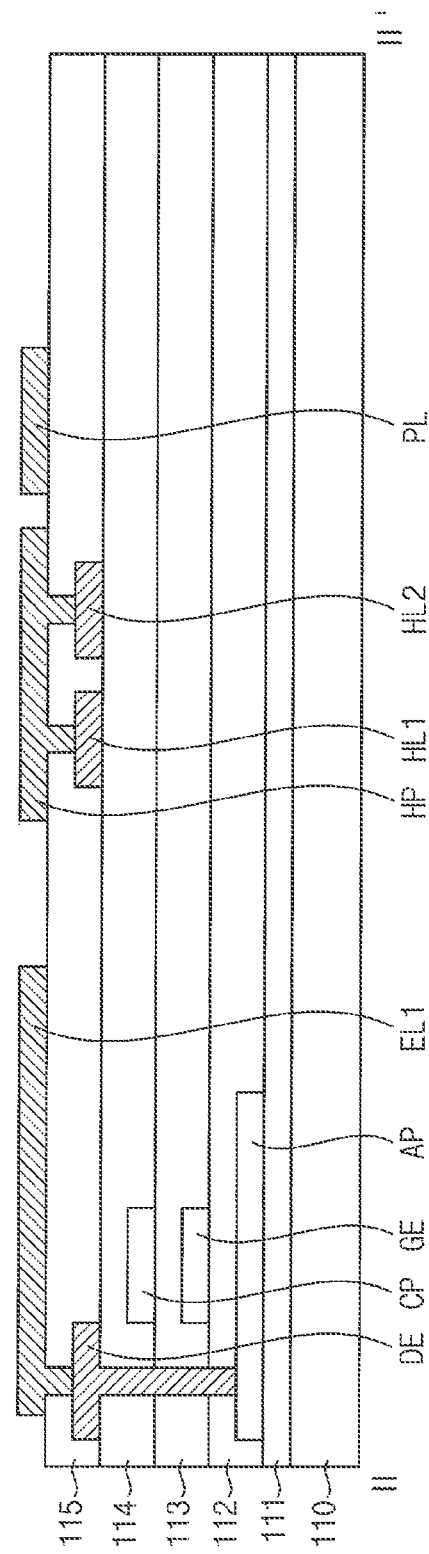

Referring to FIG. 8, a fourth insulation layer 115 is formed to cover the first source metal pattern. In an embodiment, the fourth insulation layer 115 may include an organic insulation layer, an inorganic insulation layer or a combination thereof. For example, the organic insulation layer may include a phenol resin, an acryl resin, a polyimide resin, a polyamide resin, an epoxy resin, benzocyclobutene or a combination thereof.

A lower electrode layer is then formed on the fourth insulation layer 115 and patterned to form a lower electrode pattern including a first electrode EL1. The first electrode EL1 may electrically contact the drain electrode DE or a connection electrode electrically connected to the drain electrode DE.

For example, the lower electrode layer may have a multi-layered structure including a metal oxide layer and a metal layer. The metal oxide layer may include indium tin oxide, indium zinc oxide, zinc tin oxide, indium oxide, zinc oxide, tin oxide or a combination thereof. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof.

The lower electrode pattern further includes a heating pattern HP and a driving power wiring PL. The heating pattern HP may pass through the fourth insulation layer 115 to electrically contact a first heating power wiring HL1 and a second heating power wiring HL2.

Figure 9:
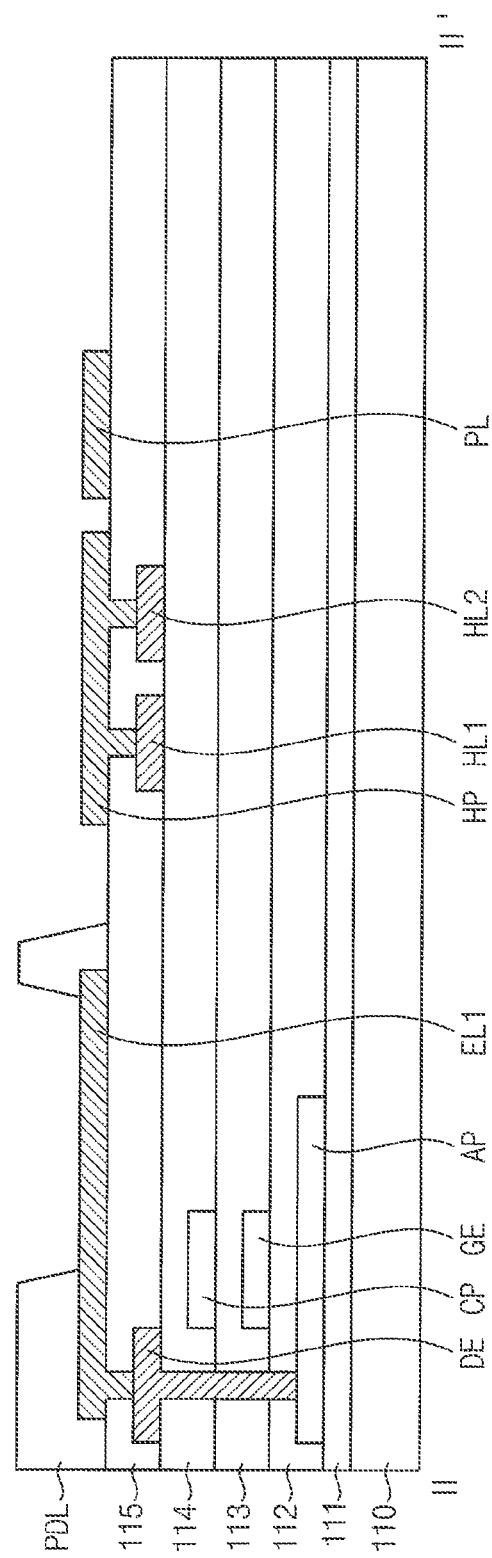

Referring to FIG. 9, a pixel-defining layer PDL is formed on the fourth insulation layer 115. The pixel-defining layer PDL may have an opening extending to and exposing at least a portion of the first electrode EL1. Furthermore, the pixel-defining layer PDL exposes the heating pattern HP and at least a portion of the driving power wiring PL. For example, the pixel-defining layer PDL may include an organic insulation material.

Figure 10:
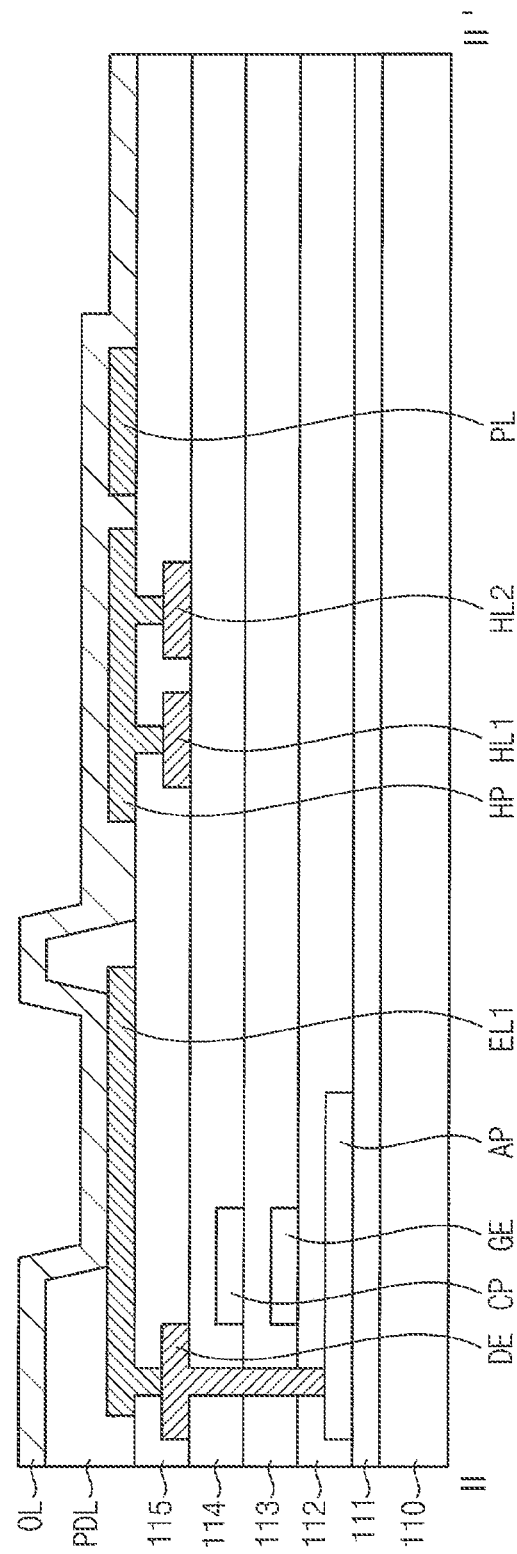

Referring to FIG. 10, an organic light-emitting layer OL is formed on the pixel-defining layer PDL and the first electrode EL1. For example, the organic light-emitting layer OL may be formed by vacuum evaporation deposition. The organic light-emitting layer OL may be formed entirely on the display area to contact the heating pattern HP and the driving power wiring PL.

Figure 11:
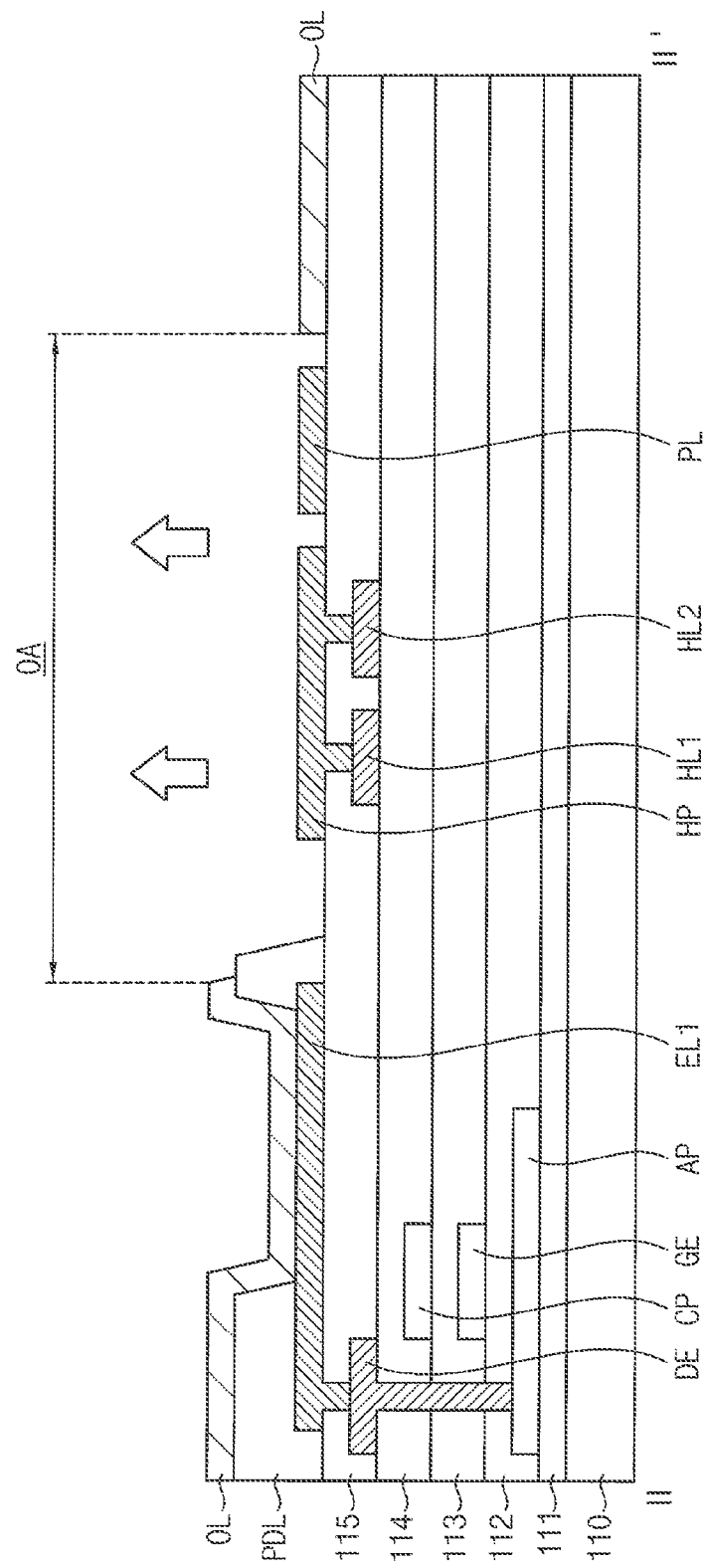

Referring to FIG. 11, the heating pattern HP is heated to remove a portion of the organic light-emitting layer OL, which is adjacent to the heating pattern HP.

In an embodiment, the first heating power wiring HL1 and the second heating power wiring HL2 may be connected to an anode and a cathode, respectively. When a voltage is applied to first heating power wiring HL1 and the second heating power wiring HL2, an electric current flows through the heating pattern HP thus generating Joule heat. The organic light-emitting layer OL is vaporized or decomposed by heat in an area adjacent to the heating pattern HP to form an opening area OA in which the organic light-emitting layer OL is removed. The process for forming and heating the organic light-emitting layer OL may be performed in a vacuum chamber.

As a result, the heating pattern HP and at least a portion of the driving power wiring PL may be exposed.

The first heating power wiring HL1 and the second heating power wiring HL2 may extend to a peripheral area of the display panel 100 to be electrically connected to a power through a power pad disposed in the peripheral area. The power pad may be removed after the heating process.

Figure 12:
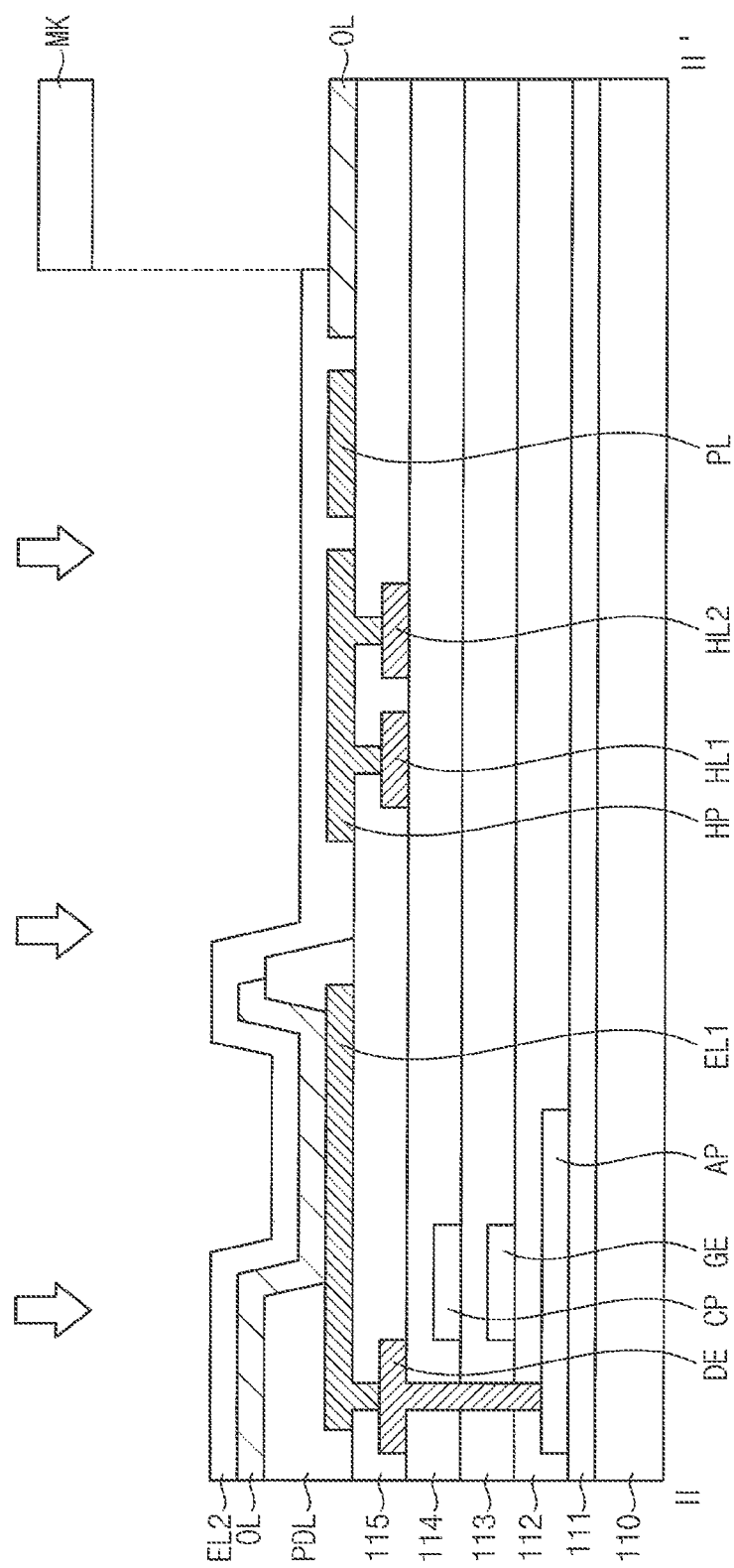

Referring to FIG. 12, a second electrode EL2 is formed on the organic light-emitting layer OL. The second electrode EL2 contacts the driving power wiring PL. Furthermore, the second electrode EL2 may contact the heating pattern HP.

The second electrode EL2 may be formed by sputtering, vacuum evaporation deposition, thermal deposition or the like. In order to form a transmitting area in the second display area DA2, a mask MK such as a fine metal mask is used. The mask MK may have an opening corresponding to a shape of the second electrode EL2. The second electrode EL2 may not be formed on an area not overlapping the opening, i.e., be formed on an area overlapping the opening, to form the transmitting area.

According to embodiments, the second electrode EL2 includes patterns separated from each other. Thus, the transmitting area may be increased in the second display area DA2 where the functional module is disposed. Furthermore, the second electrode EL2 is formed through a single deposition process without an additional patterning process or a plurality of deposition processes. Thus, damage to the organic light-emitting layer OL may be prevented, and decrease of the transmitting area may be prevented.

Furthermore, since the opening area OA of the organic light-emitting layer OL is formed by Joule heat of the heating pattern HP without using an expensive process such as laser drilling, damage to the organic light-emitting layer OL may be prevented, and a manufacturing efficiency may be increased.

In an embodiment, the heating power wiring may be formed from a same layer as the source metal pattern. However, in an embodiment, the heating power wiring may be formed from various metal layers.

Figure 13:
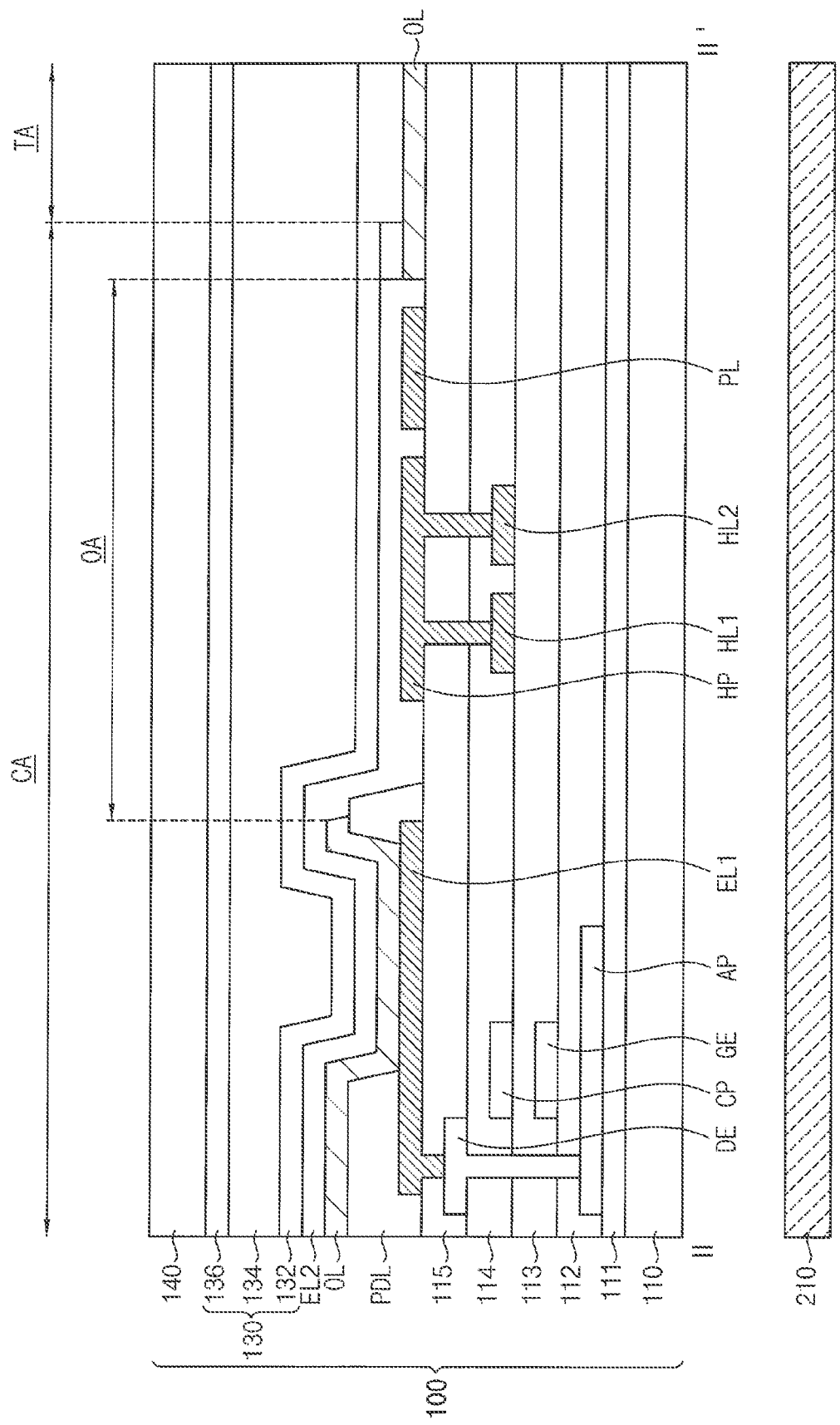
FIG. 13 is a cross-sectional view illustrating a display device according to an embodiment.

For example, as illustrated in FIG. 13, heating power wirings HL1 and HL2 may be formed from a same layer as a second gate metal pattern. In an embodiment, heating power wirings HL1 and HL2 may be formed from a same layer as a first gate metal pattern. Furthermore, a first heating power wiring HL1 and a second heating power wiring HL2 may be formed from different metal layers.

Figure 14:
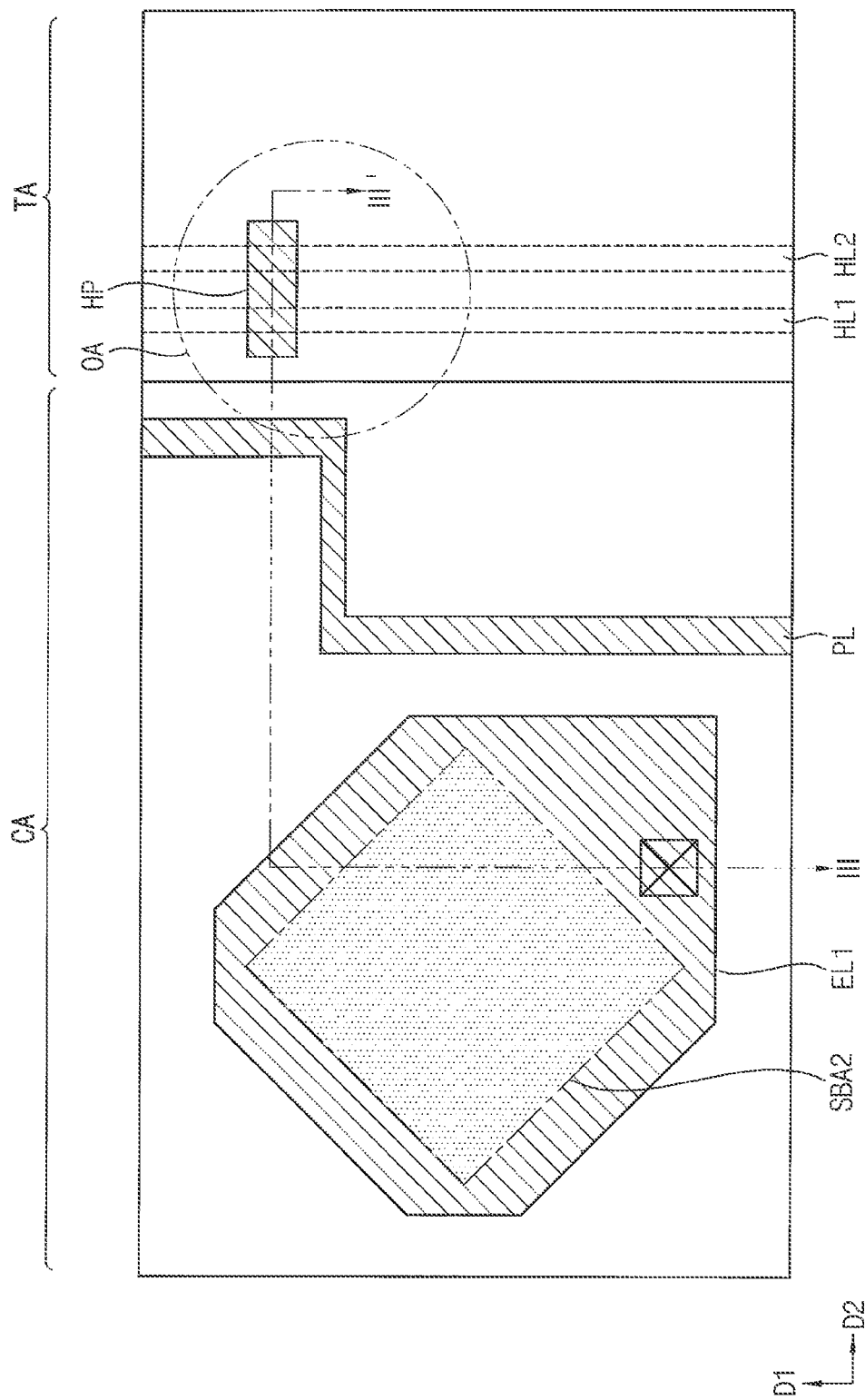
FIG. 14 is an enlarged plan view illustrating a display device according to an embodiment.
Figure 15:
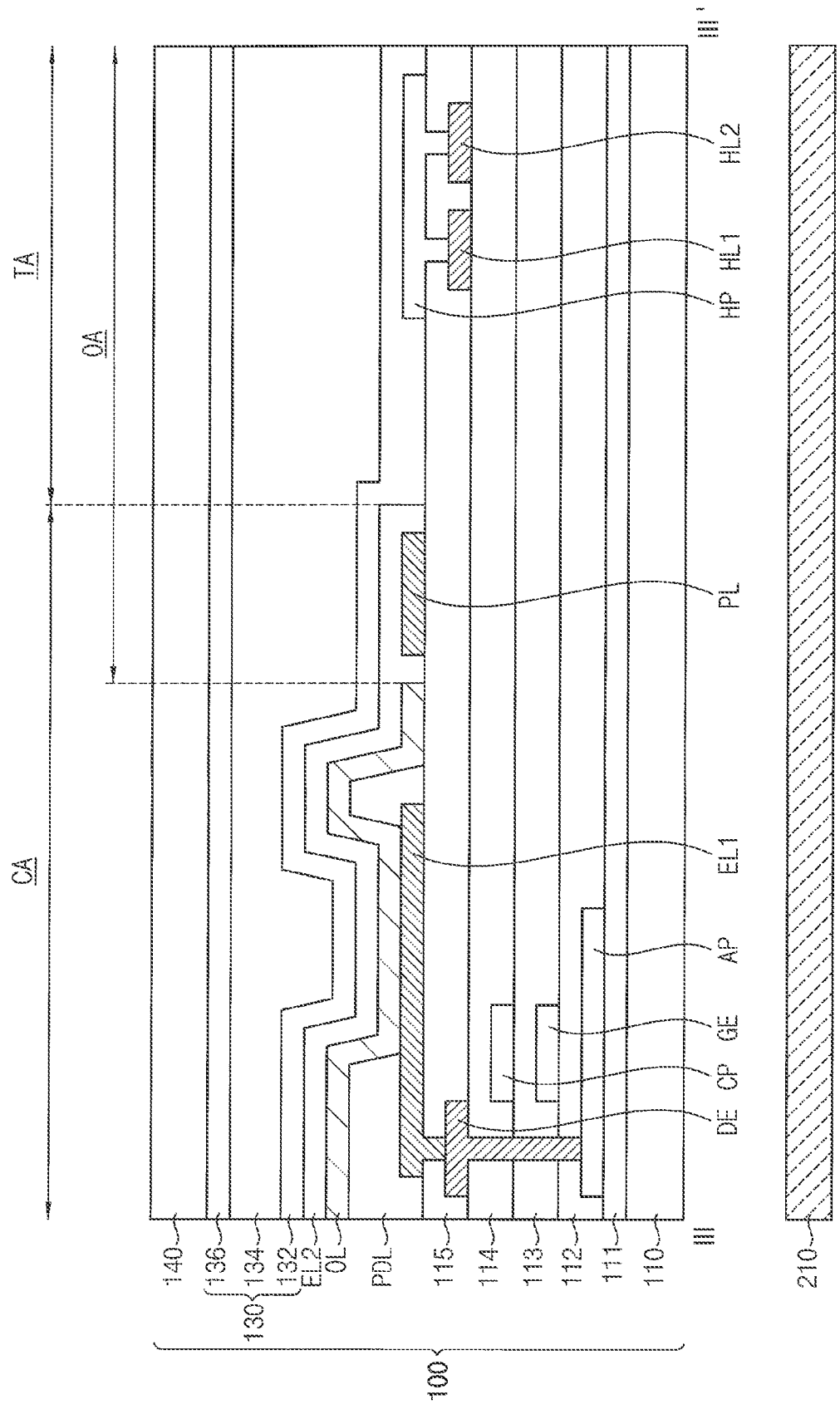
FIG. 15 is a cross-sectional view taken along the line III-III' of FIG. 14.

FIG. 14 is an enlarged plan view illustrating a display device according to an embodiment. FIG. 15 is a cross-sectional view taken along the line III-III' of FIG. 14.

Referring to FIG. 14, a heating pattern HP may be disposed in a transmitting area TA to be spaced apart from an electrode area CA. Thus, the heating pattern HP may be spaced apart from a second electrode EL2.

An opening area OA of an organic light-emitting layer OL, which is formed by the heating pattern HP may have a size larger than a size of the heating pattern HP. Thus, even if the electrode area CA is spaced apart from the heating pattern HP, the second electrode EL2 may electrically contact a driving power wiring PL through the opening area OA.

In an embodiment, as the heating pattern HP is spaced apart from the electrode area CA, damage to the organic light-emitting layer OL may be prevented when the heating pattern HP is heated. The heating pattern HP may be disposed in a peripheral portion or a center portion of the transmitting area TA.

In an embodiment, the heating pattern HP disposed in the transmitting area TA may include a transparent conductive material such as indium zinc oxide, indium tin oxide or the like to prevent decrease of light transmittance. In order to form the heating pattern HP including a transparent conductive material, the heating pattern HP may be formed from a portion of a lower electrode layer forming the first electrode EL1, or may be formed from an individual layer.

Figure 16:
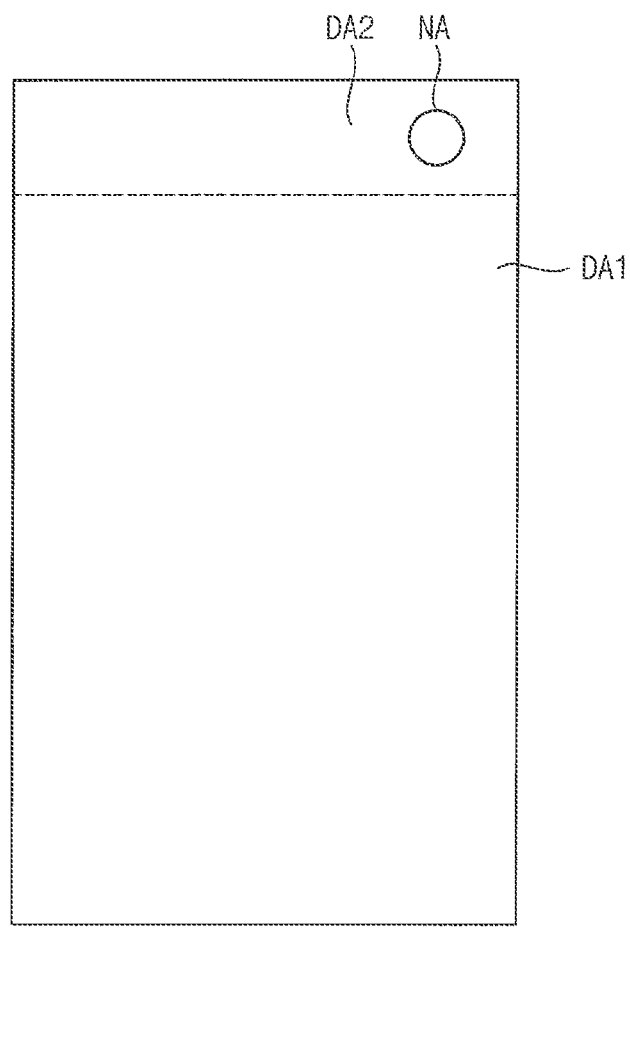
FIGS. 16, 17, 18 and 19 are plan views illustrating a display device according to embodiments.
Figure 17:
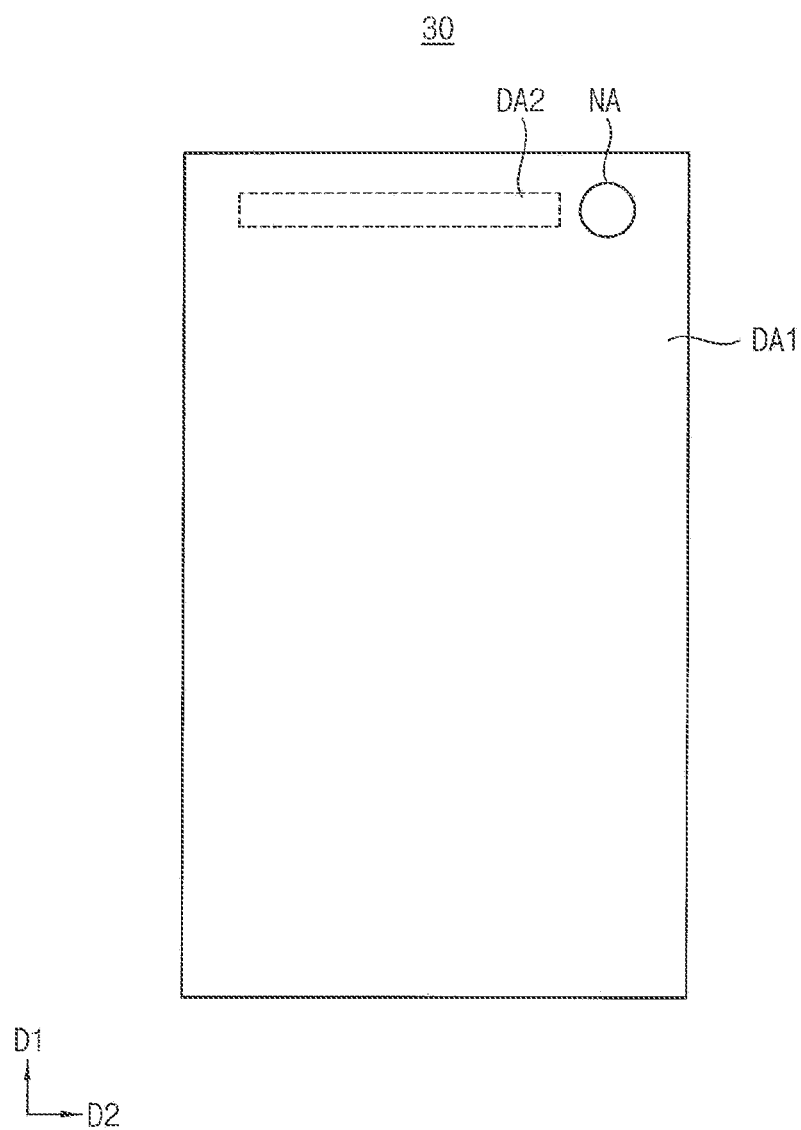
Figure 18:
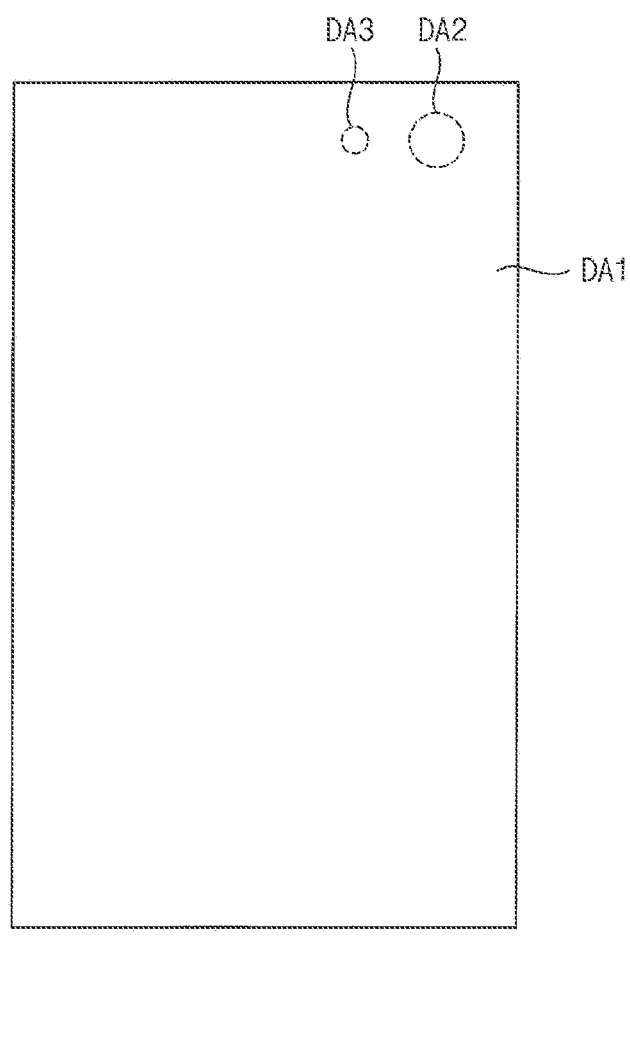

In embodiments, a second display area of a display device may have various shapes and structures. FIGS. 16, 17, and 18 are plan views illustrating a display device according to embodiments.

Referring to FIG. 16, a display device 20 includes a first display area DA1 and a second display area DA2 having a resolution, which is the number of pixel areas in a unit area, less than the first display area DA1 and including a transmitting area. The second display area DA2 may be adjacent to the first display area DA1 along a first direction D1, and may have a shape extending along a second direction D2 perpendicular to the first direction D1. Furthermore, the second display area DA2 may have a shape surrounding a non-display area NA having a hole shape. For example, a camera module may be disposed under the non-display area NA, and a sensor module may be disposed under the second display area DA2.

Referring to FIG. 17, a display device 30 includes a first display area DA1 and a second display area DA2 having a resolution less than the first display area DA1 and including a transmitting area. The second display area DA2 may have a shape extending along a second direction D2 perpendicular to a first direction D1, and may be surrounded by the first display area DA1. Furthermore, the second display area DA2 may be spaced apart from a non-display area NA having a hole shape.

Figure 19:
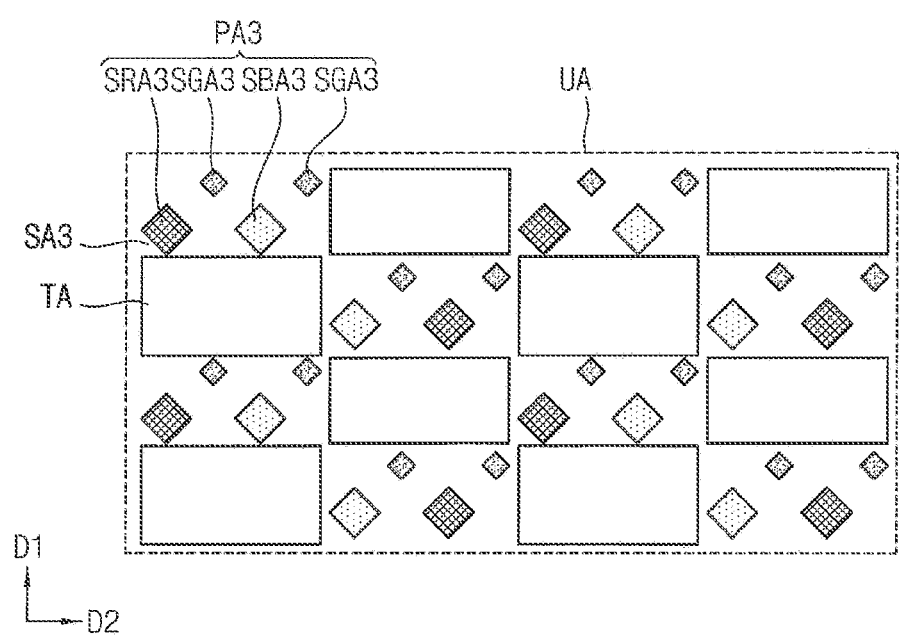

Referring to FIGS. 18 and 19, a display device 40 includes a first display area DA1 and a second display area DA2 having a resolution less than the first display area DA1 and including a transmitting area. The second display area DA2 may overlap a camera module. For example, the second display area DA2 may have a circular shape or a rectangular shape to correspond to the camera module.

The display device 40 may further include a third display area DA3. The third display area DA3 may have a resolution less than the first display area DA1 and more than the second display area DA2, and may include a transmitting area.

For example, the third display area DA3 may include a third pixel area PA3, which includes a third red pixel area SRA3, a third green pixel area SGA3, a third surrounding area SA3 and a third blue pixel area SBA3, and a transmitting area TA. For example, a ratio of the transmitting area TA to the third display area DA3 may be about 50% of an entire area of the third display area DA3. The third display area DA3 may overlap a sensor module. For example, the third display area DA3 may have a circular shape or a rectangular shape to correspond to the sensor module.

As illustrated, when a display device includes various functional modules, the display device may include display areas having different transmittances depending on a required transmittance for a corresponding functional module.

Embodiments may be applied for various display devices having a transmitting area. For example, a second display area having a less resolution may not overlap a functional module. Thus, a transparent display having a partial transmitting area may be implemented.

Embodiments may be applied to various display devices. For example, embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A method for manufacturing an organic light-emitting display device, the method comprising:
    forming a driving element on a base substrate;
    forming a first electrode electrically connected to the driving element, a heating pattern spaced apart from the first electrode and a driving power wiring adjacent to the heating pattern;
    forming an organic light-emitting layer covering the first electrode, the heating pattern and the driving power wiring;
    heating the heating pattern to remove a portion of the organic light-emitting layer, which is adjacent to the heating pattern, to form an opening area exposing the driving power wiring; and
    forming a second electrode on the organic light-emitting layer, the second electrode electrically contacting the driving power wiring through the opening area.

2. The method of claim 1, further comprising forming a heating power wiring, wherein the heating pattern is electrically connected to the heating power wiring.

3. The method of claim 2, wherein the heating pattern is configured to generate Joule heat by a power applied to the heating pattern through the heating power wiring.

4. The method of claim 1, wherein the heating pattern and the driving power wiring are disposed in a same layer as the first electrode.

5. The method of claim 1, wherein the heating pattern is formed through a different process from the first electrode, and the heating pattern includes a transparent conductive material.

6. The method of claim 1, wherein forming the second electrode includes depositing an electrode material through a mask.

7. The method of claim 6, wherein the heating pattern contacts the second electrode.

8. The method of claim 6, wherein the heating pattern is spaced apart from the second electrode.

* * * * *